United States Patent [19]
Thakur et al.

[11] Patent Number: 6,121,081
[45] Date of Patent: *Sep. 19, 2000

[54] METHOD TO FORM HEMI-SPHERICAL GRAIN (HSG) SILICON

[75] Inventors: Randhir P. S. Thakur, Boise; Lyle D. Breiner, Meridian, both of Id.

[73] Assignee: Micron Technology, Inc., Boise, Id.

[*] Notice: This patent is subject to a terminal disclaimer.

[21] Appl. No.: 09/192,641

[22] Filed: Nov. 16, 1998

Related U.S. Application Data

[63] Continuation of application No. 08/842,303, Apr. 23, 1997, Pat. No. 5,837,580, which is a continuation of application No. 08/573,467, Dec. 15, 1995, Pat. No. 5,656,531, which is a continuation-in-part of application No. 08/340,103, Nov. 15, 1994, Pat. No. 5,629,223, which is a division of application No. 08/166,058, Nov. 15, 1994, Pat. No. 5,407,534.

[51] Int. Cl.[7] .............................................. H01L 21/8234
[52] U.S. Cl. ..................... 438/238; 438/398; 438/593; 438/665; 438/684; 438/964
[58] Field of Search ................................. 438/238, 398, 438/593, 665, 684, 964

[56] References Cited

U.S. PATENT DOCUMENTS

| | | | |
|---|---|---|---|
| 5,134,086 | 7/1992 | Ahn | 437/52 |
| 5,162,248 | 11/1992 | Dennison et al. | 437/52 |
| 5,170,233 | 12/1992 | Liu et al. | 437/52 |
| 5,227,322 | 7/1993 | Ko et al. | 437/52 |
| 5,278,091 | 1/1994 | Fazan et al. | 437/52 |
| 5,318,920 | 6/1994 | Hayashide | 437/977 |
| 5,340,765 | 8/1994 | Dennison et al. | 437/52 |
| 5,342,800 | 8/1994 | Jun | 437/977 |
| 5,350,707 | 9/1994 | Ko et al. | 437/52 |
| 5,366,917 | 11/1994 | Watanabe et al. | 437/52 |
| 5,385,863 | 1/1995 | Tatsumi et al. | 437/977 |
| 5,407,534 | 4/1995 | Thakur | 438/398 |
| 5,480,826 | 1/1996 | Sugahara et al. | 437/52 |
| 5,629,223 | 5/1997 | Thakur | 438/398 |
| 5,656,531 | 8/1997 | Thakur et al. | 438/398 |

FOREIGN PATENT DOCUMENTS

| | | |
|---|---|---|
| 4280669 | 10/1992 | Japan . |
| 4315543 | 11/1993 | Japan . |

OTHER PUBLICATIONS

Uemoto et al in "IEEE Symposium on VLSI Technology" 1990, pp. 2821–2822.

"A New Cylindrical Capacitor Using HSG Si for 256 Mb DRAMS" by Watanabe et al IEDM, 1992, pp. 259–262.

NEC Corp. Forming HSG polysilicon layer, J. Appl. 71(7), Apr. 1, 1992, pagers 3538–3543.

Jun et al. The Fabrication and Electrical Properties of Modulated Stacked Capacitor, pp. 430–432, 1992 IEEE, Electron Device letter, vol. 13, No. 8.

*Primary Examiner*—Richard Elms
*Assistant Examiner*—Christian D. Wilson

[57] ABSTRACT

An embodiment of the present invention develops a process for forming Hemi-Spherical Grained silicon by the steps of: forming amorphous silicon from a gas source comprising at least one of dichlorosilane, disilane or trisilane, wherein the amorphous silicon comprising at least one impurity doped amorphous portion, the amorphous silicon is deposited at a deposition temperature no greater than 525° C.; and annealing the amorphous silicon for a sufficient amount of time and at an elevated annealing temperature, thereby transforming the amorphous silicon into the Hemi-Spherical Grained silicon.

6 Claims, 3 Drawing Sheets

METHOD TO FORM HEMI-SPHERICAL GRAIN (HSG) SILICON

This application is a continuation of Ser. No. 08/842303, filed Apr. 23, 1997, now U.S. Pat. No. 5,837,580, issued Nov. 17, 1998, which is a continuation of U.S. application Ser. No. 08/573467, filed Dec. 15, 1995, now U.S. Pat. No. 5,656,531, issued Aug. 12, 1997, which is a continuation-in-part of U.S. application Ser. No. 08/340103, filed Nov. 15, 1994, now U.S. Pat. No. 5,629,223, issued May 13, 1997, which is a divisional of U.S. application Ser. No. 08/166058, filed Nov. 15, 1994, now U.S. Pat. No. 5,407,534, issued Apr. 18, 1995. U.S. Pat. No. 5,837,580, U.S. Pat. No. 5,656,531, U.S. Pat. No. 5,629,233, and U.S. Pat. No. 5,407,534, are hereby incorporated by reference as if set forth in their entirety.

FIELD OF THE INVENTION

This invention relates to semiconductor fabrication processing and more particularly to a process for forming Hemi-Spherical Grain (HSG) silicon.

BACKGROUND OF THE INVENTION

The continuing trend of scaling down integrated circuits has forced the semiconductor industry to consider new techniques for fabricating precise components at submicron levels. Along with the need for smaller components, there has been a growing demand for devices requiring less power consumption. In the manufacture of transistors, these trends have led the industry to refine approaches to achieve thinner cell dielectric and gate oxide layers.

In dynamic semiconductor memory storage devices it is essential that storage node capacitor cell plates be large enough to retain an adequate charge (or capacitance) in spite of parasitic capacitance and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer. Though stacked (capacitor) storage cells are promising candidates to achieve sufficient storage capacitance in a limited area, as the DRAM cell size shrinks, scaling of the stacked capacitor structures is becoming more difficult.

Conventionally, it is known that the storage capacitance can be enhanced by using Hemi-Spherical Grain (HSG) silicon to form the storage node electrode without increasing the area required for the cell or the storage electrode height. The available methods include use of Low Pressure Chemical Vapor Deposition (LPCVD), engraving storage electrodes using poly film followed by P-diffusion utilizing $POCl_3$ source gas, a mixture of spin-on-glass (SOG), coating the polysilicon with resist, and HSG formation. The present invention, however, develops the formation of HSG silicon by the use of silane based sources; dichlorosilane, disilane and trisilane.

SUMMARY OF THE INVENTION

An embodiment of the present invention develops a process for forming Hemi-Spherical Grained silicon by the steps of: forming amorphous silicon from a gas source comprising at least one of dichlorosilane, disilane or trisilane; and annealing the amorphous silicon for a sufficient amount of time and at an elevated annealing temperature, thereby transforming the amorphous silicon into the Hemi-Spherical Grained silicon.

DETAILED DESCRIPTION OF THE PRESENT INVENTION

Figure 1:
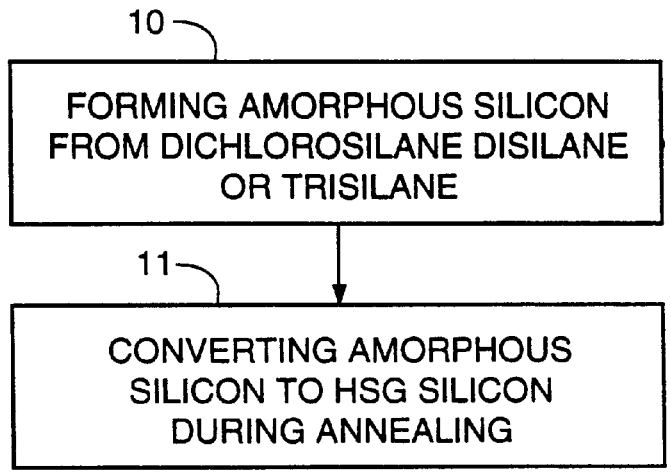
FIG. 1 is a process flow diagram of a general embodiment of the present invention.

The present invention is directed to a process for forming hemispherical grain silicon (HSG) as depicted in the process steps of FIG. 1.

Referring now to FIG. 1, in step 10, amorphous silicon is formed over a starting substrate in a reaction chamber. The amorphous silicon is formed from dichlorosilane, disilane or trisilane gas sources at a deposition temperature that is sufficient to cause the source gas to disassociate and form amorphous silicon. A deposition temperature no greater than 525° C. and in particular a deposition temperature ranging from 450° C. to 525° C. is preferred as these temperatures, in light of the present invention, have been found to be the most effective temperatures that alter grain boundary formation. It is also preferred that each amorphous silicon layer has a thickness ranging up to 500 Angstroms, such as from 200 Angstroms up to 500 Angstroms.

Figure 2:
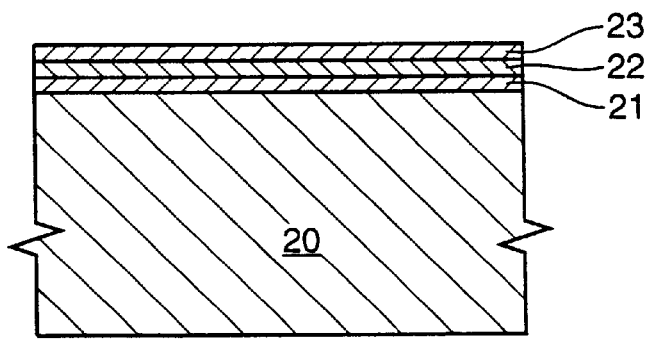
FIG. 2 is a cross-sectional view of the in-process wafer portion showing formation of multiple layers of doped and undoped amorphous silicon.

A single layer of amorphous silicon may be formed form any one of these gas sources or multiple layers of amorphous silicon may be formed from either a single gas source of any one of the source gases listed. For example, as depicted in FIG. 2 multiple layers 21, 22, 23 of amorphous silicon have been formed. Layer 21 may be formed from dichlorosilane, layer 22 may be formed from disilane and layer 23 may be formed from trisilane. Another approach may be that layer 21 be formed from dichlorosilane, layer 22 be formed from dichlorosilane and layer 23 be formed from trisilane. In other words any one of the layers may be formed from any one of the gas sources listed and additional layers may be added. Another important aspect of the present invention is that alternate layers be doped with conductive impurities which will affect the orientation of grain boundaries of the between each adjacent layer.

A preferred embodiment of the present invention is that layers 21, 22 and 23 alternate as far as conductivity is concerned. For example, layers 21 and 23 may be conductively doped while layer 22 is not (or visa-versa). Each layer will, in effect, have dissimilar grain boundaries than its superjacent layer. Creating these dissimilar grain boundaries between superjacent layers, by forming the amorphous silicon from the three different gas sources listed and by alternating layers being conductively doped and non-doped help provide a desired amorphous structure having dissimilar grain boundaries prior to the next step.

Figure 3:
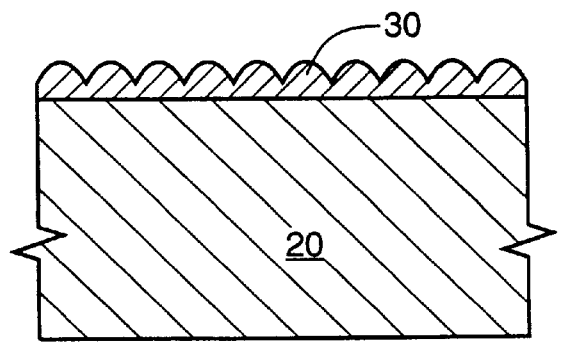
FIG. 3 is a cross-sectional view of the in-process wafer portion of FIG. 2 after formation of HSG silicon during an anneal.

In step 11, the amorphous silicon is then transformed into Hemi-Spherical Grain (HSG) silicon by subjecting the amorphous silicon to an annealing step at an elevated annealing temperature sufficient to cause HSG formation (a temperature ranging from 500° C. to 800° C. is preferred). The pressure used is set at a preferred pressure ranging from $1 \times 10^{-1}$ Torr to $1 \times 10^{-6}$ Torr. The result is the transformation of a basically smooth silicon surface into HSG silicon that is dependent on the makeup of the grain boundaries in the amorphous silicon structure. FIG. 3 demonstrates the effects of step 11 of FIG. 1 when the amorphous silicon structure is subjected to this step. As shown, HSG layer 30 is formed during this step and it is preferred that the grain formed consumes substantially the entire thickness of the amorphous silicon layer.

The amorphous silicon may be in-situ doped via a hydrogen dopant source, such as at least one of $PH_3$ or $AsH_3$ and the dopant source may be diluted with an inert gas, such as at least one of He, Ar or $N_2$. The process, as depicted in FIG. 1, may be performed in a furnace type reactor, a Rapid Thermal Chemical Vapor Deposition type reactor or a plasma type reactor.

Regardless of the reactor chosen, the present invention may be implemented into any semiconductor process that would benefit from the formation of HSG and in particular a dynamic random access process or an erasable programmable read only memory (EPROM) process where the HSG silicon is used to form a storage electrode, such as a capacitor plate in a memory cell or a floating gate in a EPROM.

Figure 4:
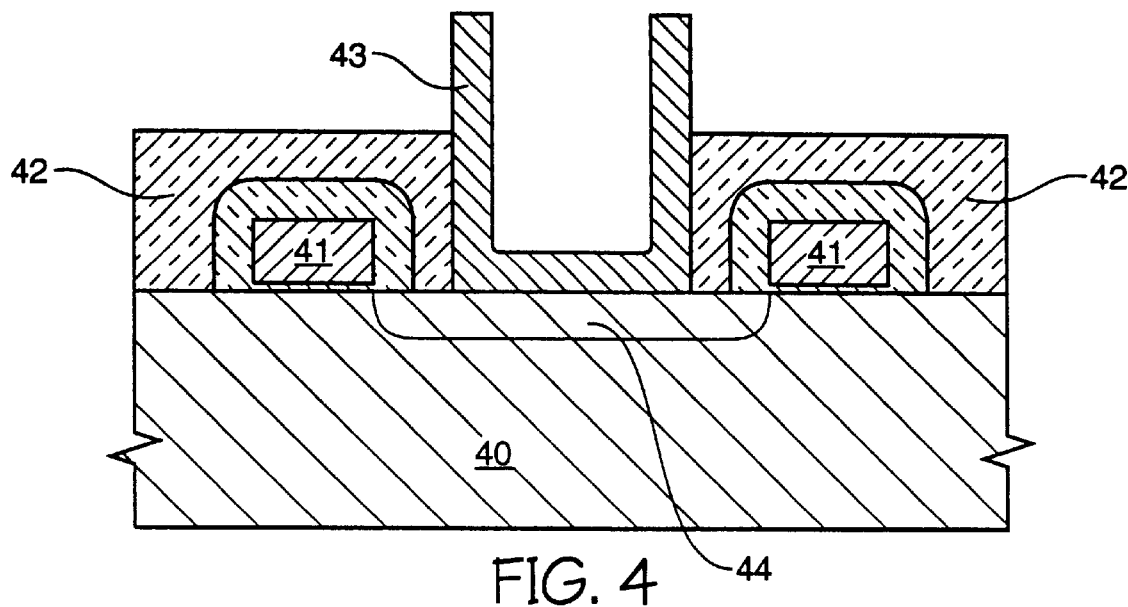
FIG. 4 is a composite cross-sectional view of an in-process wafer portion depicting the beginning stages of forming a DRAM container storage cell which utilizes the present invention.
Figure 5:
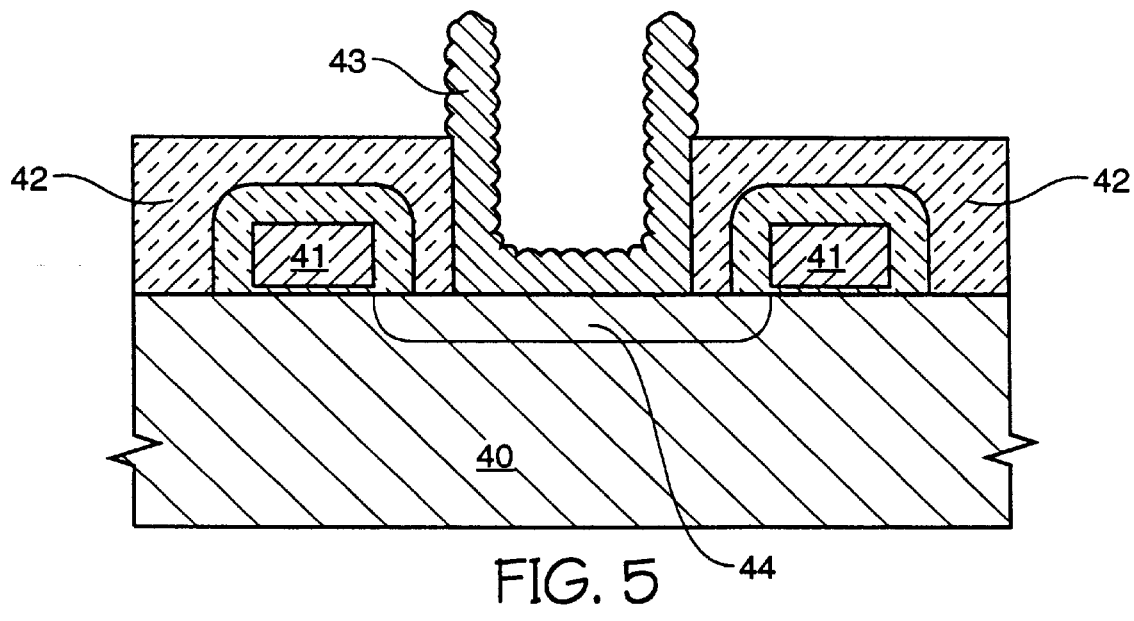
FIG. 5 is a cross-sectional view of the in-process wafer portion of FIG. 4 after formation of HSG silicon during an anneal.
Figure 6:
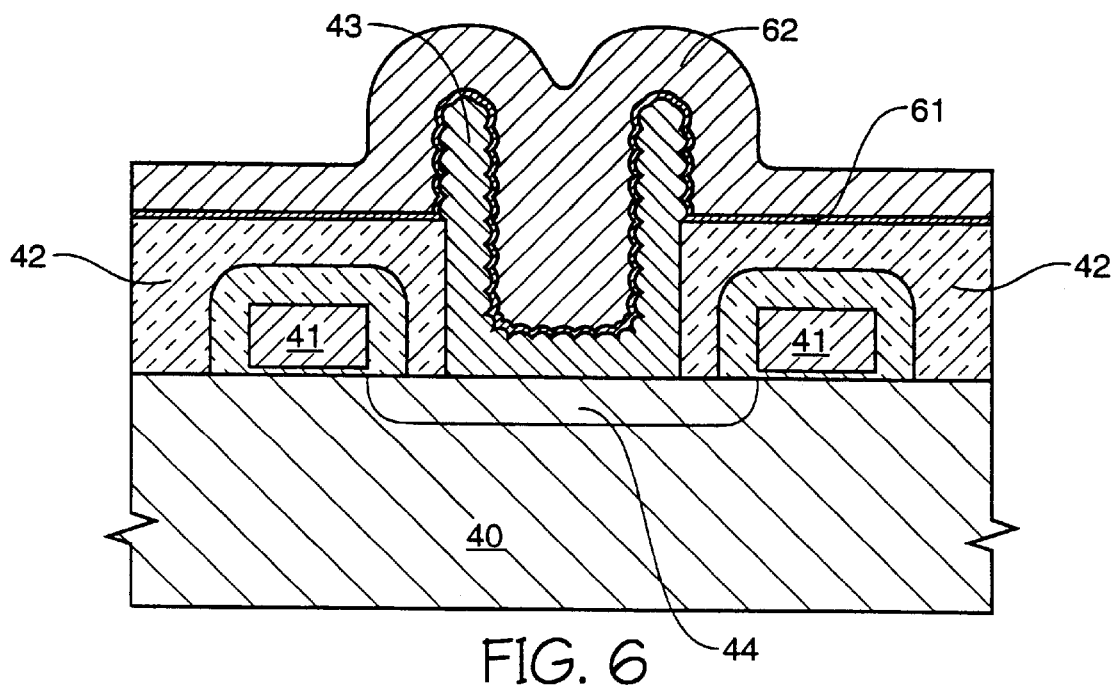
FIG. 6 is a cross-sectional view of the in-process wafer portion of FIG. 4, depicting a completed DRAM container storage cell.

As mentioned above and to serve as an example, one of the many uses of the present invention is depicted in the construction of a DRAM container storage cell developed in FIGS. 4–6.

Referring now to FIG. 4, a starting substrate 40 is processed with diffusion region 44 formed therein, which is formed between word lines 41. A planarized insulating layer 42 (typically borophosphosilicate glass (BPSG)) is formed over substrate 40, word lines 41 and diffusion region 44. An opening in layer 42 is formed to provide access to diffusion region 44. Then container structure 43 is formed from amorphous silicon that is deposited by the use of dichlorosilane, disilane or trisilane at a temperature that is sufficient to cause dissociation of the gas source to form amorphous silicon (A deposition temperature that is no greater than 525° C. and specifically a temperature ranging from 450° C. to 525° C. is preferred.) as set forth in the general embodiments of FIGS. 2–3. In this case, container structure 43 makes contact to diffusion region 44 and extends above layer 42. It is preferred that each amorphous silicon layer has a thickness ranging up to 500 Angstroms, such as from 200 Angstroms up to 500 Angstroms.

Referring now to FIG. 5, silicon structure 43 is subjected to a high vacuum anneal at an elevated annealing temperature sufficient to cause HSG formation (a temperature ranging from 500° C. to 800° C. is preferred) and at a pressure of $1 \times 10^{-1}$ Torr to $1 \times 10^{-06}$ Torr or less. The result is the transformation of the basically smooth silicon surface of structure 43 (in FIG. 4) into HSG silicon (the rugged structure 43 in FIG. 5).

As taught in FIG. 1, the amorphous silicon structure 43 may be insitu doped via a hydrogen dopant source, such as at least one of $PH_3$ or $AsH_3$ and the dopant source may be diluted with an inert gas, such as at least one of He, Ar or $N_2$.

Referring now to FIG. 6, the DRAM storage cell is completed by forming cell dielectric layer 61 over structure 43, followed by the formation of a second cell plate 62 (typically a conductively doped polysilicon or metal based layer). From this point on, the wafer is completed using conventional fabrication process steps.

It is to be understood that although the present invention has been described with reference to a preferred embodiment, various modifications, known to those skilled in the art, may be made to the structures and process steps presented herein without departing from the invention as recited in the several claims appended hereto.

What is claimed is:

1. A process for forming hemi-spherical grained silicon comprising the steps of:

forming a silicon layer; and exposing said silicon layer to a fluorine based gas mixture during an annealing period to turn the surface of said silicon layer into said hemi-spherical grained silicon, said fluorine based gas mixture is a gas selected from the group consisting of $NF_3$, $CF_4$ and $C_2F_6Cl_2$.

2. A process for forming capacitor plates, said process comprising the steps of:

forming a silicon layer over a pair of neighboring parallel conductive lines, said silicon layer making contact to an underlying conductive region;

patterning said silicon layer to form individual silicon capacitor plates; and exposing said silicon capacitor plates to a fluorine based gas mixture during an annealing period to turn an exposed surface of said silicon capacitor plates into hemi-spherical grained silicon, said fluorine based gas mixture is a gas selected from the group consisting of $NF_3$, $CF_4$ and $C_2F_6Cl_2$.

3. A process for forming a storage capacitor, said process comprising the steps of:

forming a first silicon layer over a pair of neighboring parallel conductive lines, said silicon layer making contact to an underlying conductive region;

patterning said first silicon layer to form an individual silicon capacitor plate;

exposing said silicon capacitor plate to a fluorine based gas mixture during an high vacuum annealing period to turn an exposed surface of said silicon capacitor plate into hemi-spherical grained silicon, said fluorine based gas mixture is a gas selected from the group consisting of $NF_3$, $CF_4$ and $C_2F_6Cl_2$;

conductively doping said capacitor plate;

forming a capacitor dielectric layer on said silicon capacitor plate; and forming a second conductive silicon layer on said capacitor dielectric layer.

4. A process for forming rugged silicon comprising the steps of:

forming a silicon layer having a smooth surface; and exposing said silicon layer to a fluorine based gas mixture during an annealing period to turn at least a portion of said smooth surface into a rugged surface, said fluorine based gas mixture is a gas selected from the group consisting of $NF_3$, $CF_4$ and $C_2F_6Cl_2$.

5. A process for forming capacitor plates, said process comprising the steps of:

forming a silicon layer having a smooth surface over a pair of neighboring parallel conductive lines, said silicon layer making contact to an underlying conductive region;

patterning said silicon layer to form individual silicon capacitor plates; and exposing said silicon capacitor plates to a fluorine based gas mixture during an annealing period to turn at least a portion of said smooth surface into a rugged surface, said fluorine based gas mixture is a gas selected from the group consisting of $NF_3$, $CF_4$ and $C_2F_6Cl_2$.

6. A process for forming a storage capacitor, said process comprising the steps of:

forming a first silicon layer having a smooth surface over a pair of neighboring parallel conductive lines, said silicon layer making contact to an underlying conductive region;

patterning said first silicon layer to form a silicon capacitor plate;

exposing said silicon capacitor plate to a fluorine based gas mixture during an high vacuum annealing period to turn at least a portion of said smooth surface into a rugged surface, said fluorine based gas mixture is a gas selected from the group consisting of $NF_3$, $CF_4$ and $C_2F_6Cl_2$;

conductively doping said capacitor plate;

forming a capacitor dielectric layer on said silicon capacitor plate; and forming a second conductive silicon layer on said capacitor dielectric layer.

* * * * *